United States Patent
Zhou et al.

(10) Patent No.: US 7,870,889 B2
(45) Date of Patent: Jan. 18, 2011

(54) HEAT DISSIPATION DEVICE WITH A HEAT PIPE

(75) Inventors: Shi-Wen Zhou, Shenzhen (CN); Guo Chen, Shenzhen (CN); Peng Liu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 876 days.

(21) Appl. No.: 11/752,902

(22) Filed: May 23, 2007

(65) Prior Publication Data

US 2008/0142194 A1    Jun. 19, 2008

(30) Foreign Application Priority Data

Dec. 13, 2006   (CN)   ................. 2006 1 0157527

(51) Int. Cl.
*F28F 7/00*     (2006.01)
*H05K 7/20*    (2006.01)

(52) U.S. Cl. .................. 165/80.3; 165/104.21

(58) Field of Classification Search ............ 165/104.21, 165/80.3, 185, 163; 361/704, 715; 174/15.2, 174/16.3; 257/715

See application file for complete search history.

(56) References Cited

U.S. PATENT DOCUMENTS 4,633,371 A * 12/1986 Nagy et al. ................ 361/699
5,852,339 A * 12/1998 Hamilton et al. ............. 313/11
6,011,216 A *  1/2000 Kitahara et al. ............ 174/16.3
6,315,033 B1* 11/2001 Li ......................... 165/104.33
6,439,298 B1*  8/2002 Li ......................... 165/104.33
6,653,755 B2* 11/2003 Machiroutu ................. 310/64
6,851,467 B1*  2/2005 Bamford et al. ............ 165/80.3
7,142,422 B2   11/2006 Lee
2004/0130871 A1*  7/2004 Wellhofer ................... 361/688

FOREIGN PATENT DOCUMENTS

| CN | 2490701 Y | 5/2002 |
| CN | 1581471 A | 2/2005 |
| TW | 508057 | 10/2002 |
| TW | M246683 | 10/2004 |

* cited by examiner

*Primary Examiner*—Tho V Duong
(74) *Attorney, Agent, or Firm*—Jeffrey T. Knapp

(57) ABSTRACT

A heat dissipation device comprises a radiator comprising a collar, a core received in the collar and a helical heat pipe embedded in a circumferential face of the core. The collar has a receiving hole and a plurality of fins extending radially and outwardly from an outer face of the collar. The core together with the heat pipe is received in the receiving hole of the radiator. The core has a flat bottom face and a top face opposite to the bottom face. The heat pipe is located between the radiator and the core and thermally contacts the collar of the radiator and the core. The heat pipe extends from the bottom face of the core to the top face of the core, and has a flattened bottom face coplanar with the bottom face of the core for contacting with an electronic device.

16 Claims, 3 Drawing Sheets

HEAT DISSIPATION DEVICE WITH A HEAT PIPE

BACKGROUND OF THE INVENTION

1. Field of the Invention

The present invention generally relates to heat dissipation devices, and more particularly to a heat dissipation device having a heat pipe for cooling an electronic component, such as an integrated circuit package.

2. Description of Related Art

With the advance of computer technology, electronic devices such as a central processing unit (CPU) are achieving ever higher operating speeds. It is well known that the faster an electronic device operates, the more heat it generates. If the heat is not quickly dissipated from the electronic device, the operation of the electronic device will suffer instability or even malfunction. Generally, in order to ensure normal operation of the electronic device, a heat dissipation device is used to dissipate the heat generated by the electronic device.

Typically, a finned metal heat sink is attached to an outer face of a CPU to remove the heat therefrom. The related metal heat sink is made of a highly heat-conductive metal, such as copper or aluminum, and generally comprises a solid metal central core for contacting with the CPU to absorb the heat therefrom and a plurality of curved fins radially extending from a circumferential face of the core for dissipating the heat. In use, a bottom of the core thermally contacts the CPU and absorbs heat from the CPU. The heat in the core is then transferred to the fins to be dissipated to ambient air. However, as the operating speed of electronic components has increased markedly in recent years, heat sinks that transfer the heat only by metal conduction are insufficient, as a result, the heat in the bottom of the solid metal central core cannot be transferred to the whole heat dissipation device quickly enough.

Heat pipes, which operate via phase change of working liquid sealed in a hollow pipe, have been widely used due to their excellent heat transfer properties. Thus the additional use of heat pipes serves to reduce thermal gradients in the heat sink. However, a traditional combination of the aforesaid heat sink and a heat pipe fails to achieve low heat resistance, large contact area and great heat transfer capacity between the heat sink and the heat pipe. Accordingly, what is needed is a heat dissipation device incorporating a heat pipe which has an enhanced heat dissipation performance.

SUMMARY OF THE INVENTION

According to an embodiment of the present invention, a heat dissipation device comprises a radiator comprising a collar, a core received in the collar and a spiral heat pipe embedded in the core. The collar has a receiving hole and a plurality of curved fins extending radially and outwardly from an outer face of the collar. The core is received in the receiving hole of the radiator and has a flat bottom face and a top face opposite to the bottom face. The heat pipe is located between the radiator and the core and thermally contacts the collar of the radiator and the core, and extending from the bottom face of the core to the top face of the core; the heat pipe has a flattened bottom face coplanar with the bottom face of the core for contacting with an electronic device. The heat pipe is fitted in a helical groove defined in a circumferential periphery of the core, which has a column-like shape.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
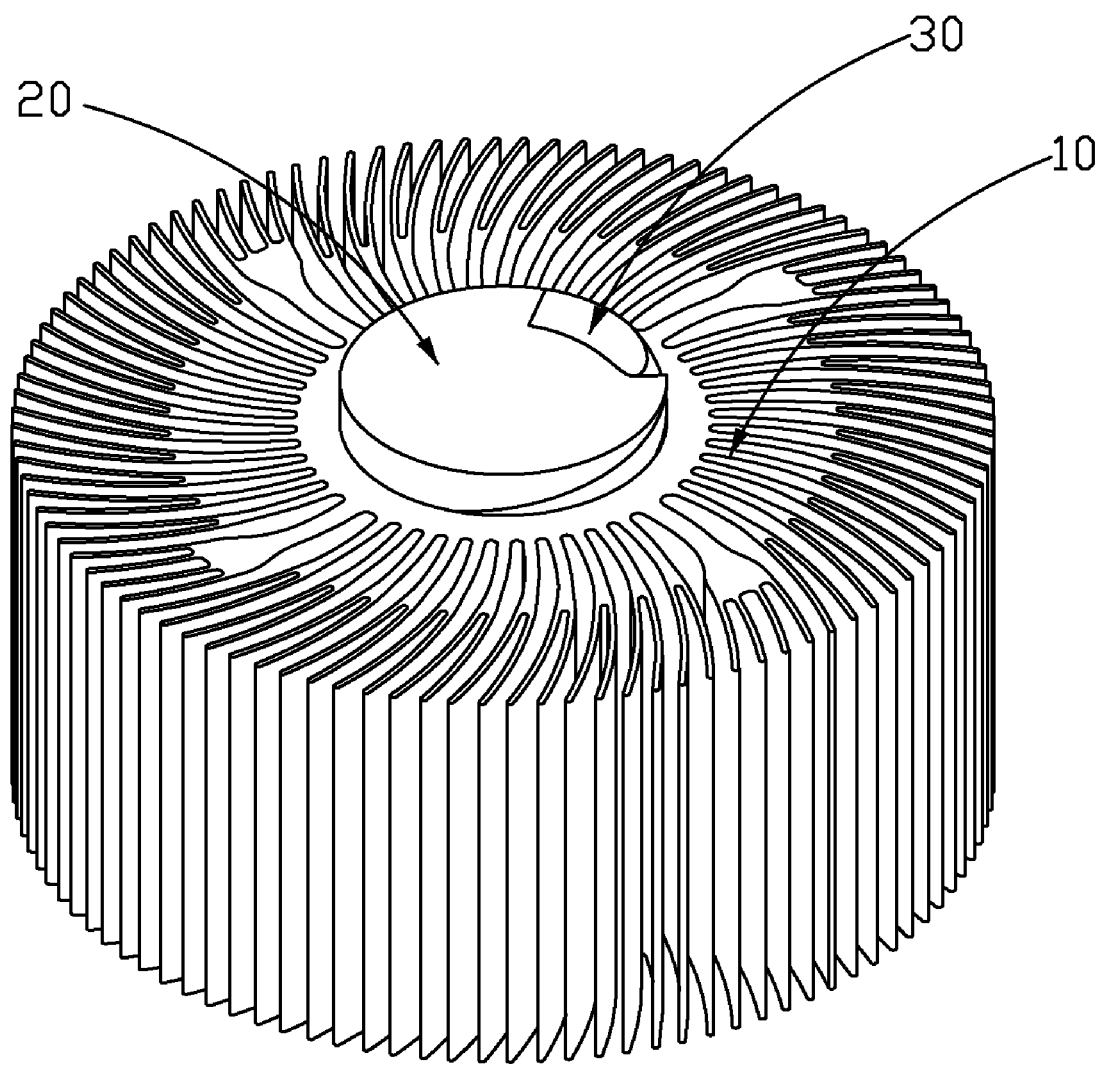
FIG. 1 is an assembled, inverted, isometric view of a heat dissipation device in accordance with a preferred embodiment of the present invention.
Figure 2:
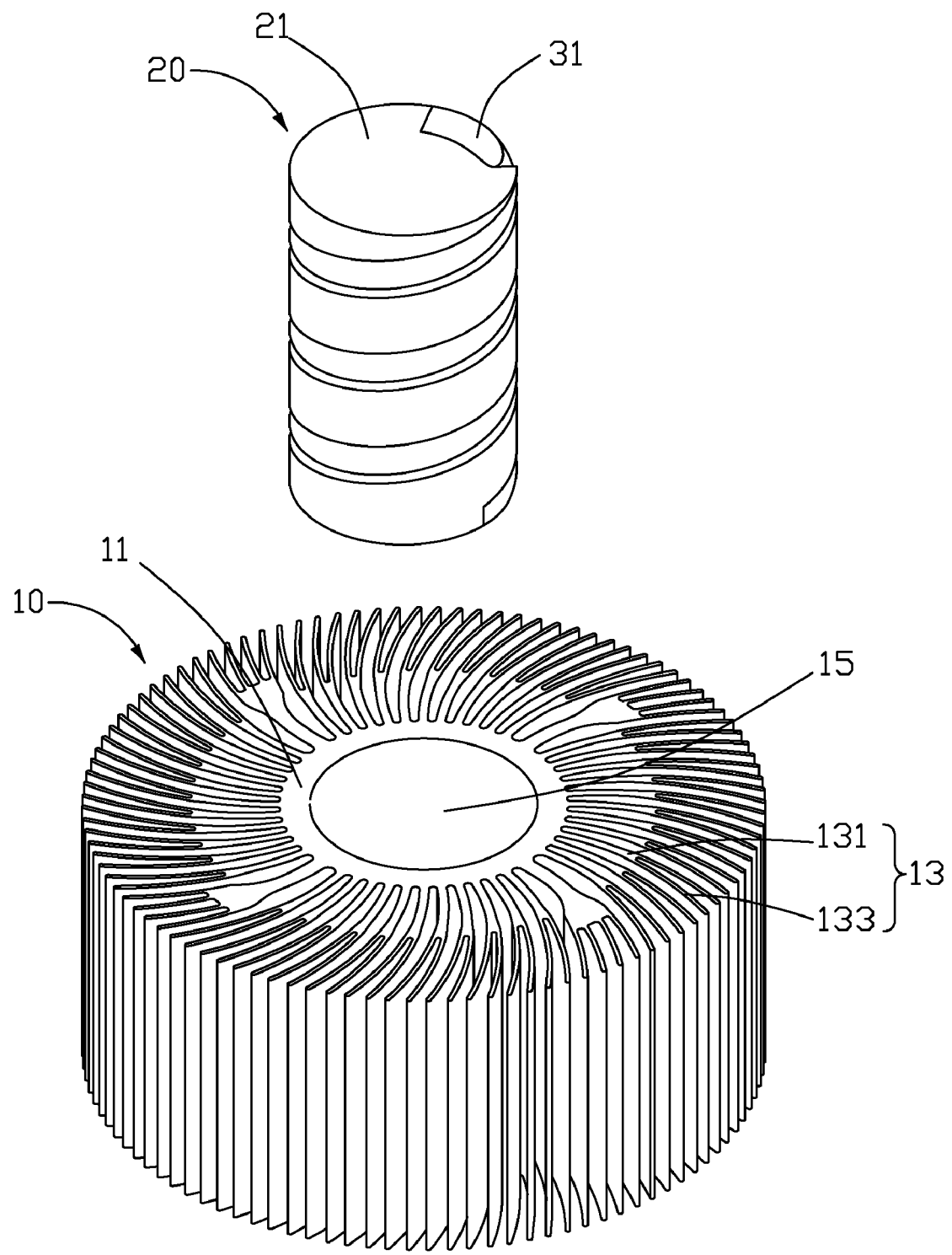
FIG. 2 is an exploded view of FIG. 1.

Referring to FIG. 1 and FIG. 2, a heat dissipation device in accordance with a preferred embodiment of the present invention is shown. The heat dissipation device is configured for removing heat from a heat-generating electronic device (not shown), such as a CPU (not shown). The heat dissipation device comprises a radiator 10, a heat conducting core 20 thermally received in the radiator 10 and a heat pipe 30 embedded in the heat conducting core 20. The heat absorbed by the core 20 and the heat pipe 30 is transferred to the radiator 10 and finally is dissipated to ambient air.

The radiator 10 is formed by aluminum extrusion and comprises a cylindrical collar 11 and a plurality of curved fins 13 extending radially and outwardly from an outer circumferential face of the collar 11. A receiving hole 15 is defined axially through a center of the radiator 10 and is surrounded by an inner face of the collar 11. Each of the fins 13 curves in a clockwise direction along a circumferential direction of the collar 11. Most of the fins 13 each comprise a trunk 131 and a pair of tines 133 divided from the trunk 131 at an outer portion of the respective fin 13. Among the fins 13, four ones each extend four tines 133 from the trunk 131 thereof; the four ones are evenly distributed along a circumferential direction of the radiator 10. The dividing of each fin 13 into the tines 133 occurs at a dividing point that may, for example, be about halfway along the length of the fins 13.

Figure 3:
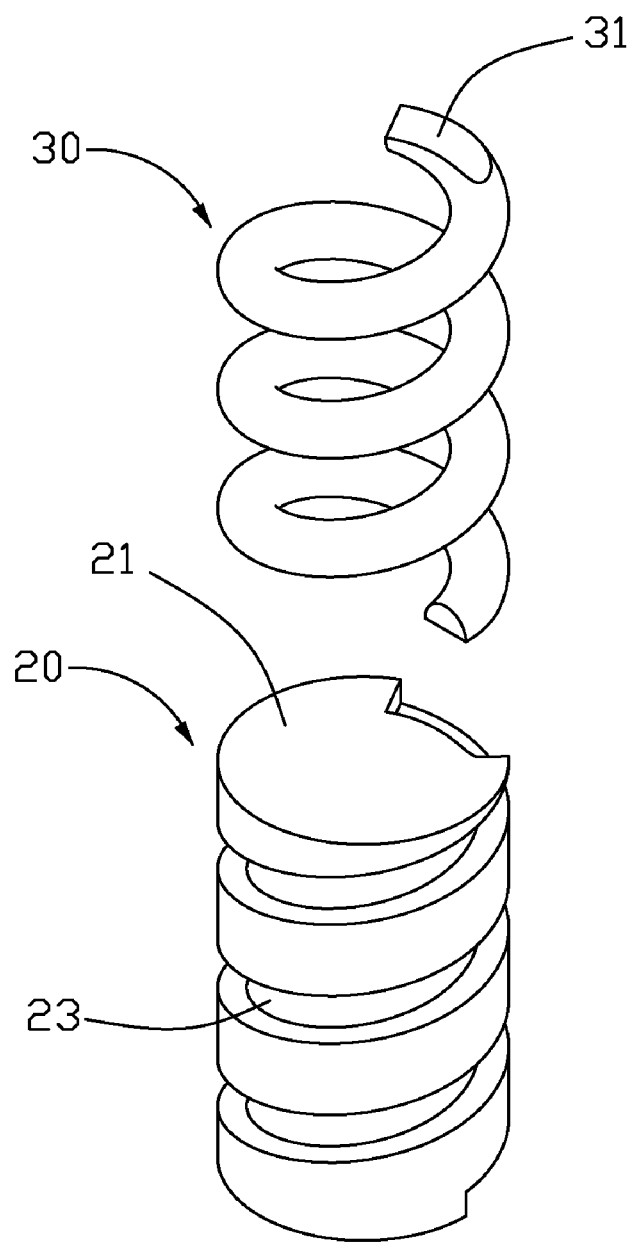
FIG. 3 shows a heat pipe and a core of the heat dissipation device of FIG. 2.

Referring also to FIG. 3, the core 20 has a cylindrical shape, and can be made of highly thermally conductive materials, for example, copper or aluminum. The core 20 has a flat bottom face 21 at a bottom thereof for engaging with the CPU to remove the heat from the CPU, and a top face (not labeled) on an opposite side to the bottom face 21. A helical groove 23 is helically defined in a circumferential face of the core 20. The groove 23 extends from the bottom face 21 to the top face of the core 20. The groove 23 is for thermally receiving the heat pipe 30 therein. In this preferred embodiment, the core 20 has a cylindrical shape; in other embodiments, the core 20 can be other shape, such as cone shaped.

The heat pipe 30 has a helical conformation corresponding to the shape of the groove 23 of the core 20. A cross section shape of the heat pipe 30 corresponds to a cross sectional shape of the groove 23. A bottom portion of the heat pipe 30 is flattened to define a flat bottom face 31. The bottom face 31 of the heat pipe 30 is coplanar with the bottom face 21 of the core 20 so as to engage with a top face of the CPU.

In assembly of the heat dissipation device, the heat pipe 30 is thermally received in the groove 23 of the core 20 by soldering or other means. The heat pipe 30 connects the bottom face 21 of the core 20 with the top face of the core 20, wherein the bottom face 31 of the heat pipe 30 is coplanar with the bottom face 21 of the core 20. An exposed outer face of the heat pipe 30 and the circumferential face of the core 20 cooperatively define a substantially smooth circumferential contacting face. The heat pipe 30 and the core 20 are received in the receiving hole 15 of the radiator 10, with the contacting face of the heat pipe 30 and the core 20 forming an intimate thermal contact with the inner face of the collar 11 of the radiator 10.

In use, the heat dissipation device is attached to the CPU with the bottom face 31 of the heat pipe 30 and the bottom face 21 of the core 20 in contact with the CPU. Heat generated by the CPU is absorbed by the heat pipe 30 and the core 20. A part of the heat is absorbed by the bottom portion of the heat pipe 30, and is then quickly and evenly transferred to the other portions of the heat pipe 30, and is transmitted to the collar 11. Another part of the heat is transmitted to the collar 11 through the core 20. The heat is transferred to the fins 13 from the collar 11 of the radiator 10. Finally, the fins 13 dissipate the heat to ambient air.

Alternatively, the inner face of the collar 11 of the radiator 10 can define a groove (not shown) for receiving the heat pipe 30 instead of the groove 23 of the core 20.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
    a radiator comprising a collar having a receiving hole and a plurality of fins extending radially and outwardly from an outer face of the collar;
    a core thermally received in the receiving hole of the radiator and having a flat bottom face and a top face opposite to the bottom face; and
    a heat pipe located between the radiator and the core and thermally contacting the collar of the radiator and the core, and extending from the bottom face of the core to the top face of the core, the heat pipe having a flattened bottom face coplanar with the bottom face of the core for contacting an electronic device;
    wherein the heat pipe is helical in shape and surrounds the core, and the core defines a helical groove in a circumferential face thereof, the heat pipe being received in the helical groove.

2. The heat dissipation device as described in claim 1, wherein the heat pipe extends through the receiving hole of the radiator from one end to an opposite end of the radiator.

3. The heat dissipation device as described in claim 1, wherein an exposed outer face of the heat pipe and the circumferential face of the core intimately engage with an inner face of the collar of the radiator.

4. The heat dissipation device as described in claim 1, wherein the fins are curved in shape.

5. The heat dissipation device as described in claim 1, wherein the core is cylindrical.

6. The heat dissipation device as described in claim 1, wherein each of the fins curves along a clockwise circumferential direction of the collar.

7. A heat dissipation device comprising:
    a core having a bottom face for engaging with an electronic component;
    a plurality of fins radially surrounding the core; and
    a heat pipe located between the core and the fins, the heat pipe helically surrounding and thermally contacting the core from one end to an opposite end of the core;
    wherein the core is cylindrical, and each of the fins curves along a circumferential direction of the core.

8. The heat dissipation device as described in claim 7, wherein the heat pipe has a flattened bottom face coplanar with the bottom face of the core for directly contacting the electronic component.

9. The heat dissipation device as described in claim 7, wherein the core defines a helical channel therein, the heat pipe being received in the channel.

10. The heat dissipation device as described in claim 7, wherein the fins are integrally formed by aluminum extrusion from a piece of metal stock.

11. A heat dissipation device comprising:
    a radiator comprising a collar having a receiving hole and a plurality of fins extending radially and outwardly from an outer face of the collar;
    a core received in the receiving hole of the radiator, thermally connecting with the collar and having a flat bottom face adapted for thermally connecting with a heat-generating electronic device and a top face opposite to the bottom face; and
    a helical heat pipe located between the radiator and the core and thermally contacting the collar of the radiator and the core.

12. The heat dissipation device as described in claim 11, wherein the heat pipe has a flattened bottom face coplanar with the bottom face of the core, adapted for contacting the electronic device, and the heat pipe extends upwardly to reach the top face of the core.

13. The heat dissipation device as described in claim 11, wherein the core has a column-like shape and defines a helical groove in a circumferential periphery thereof, the heat pipe being received in the helical groove.

14. The heat dissipation device as described in claim 11, wherein the heat pipe extends from the bottom surface toward the top surface of the core.

15. The heat dissipation device as described in claim 14, wherein the heat pipe has a bottom face coplanar with the bottom surface of the core.

16. A heat dissipation device comprising:
    a radiator comprising a collar having a receiving hole and a plurality of fins extending radially and outwardly from an outer face of the collar;
    a core thermally received in the receiving hole of the radiator and having a flat bottom face and a top face opposite to the bottom face; and
    a heat pipe located between the radiator and the core and thermally contacting the collar of the radiator and the core, and extending from the bottom face of the core to the top face of the core, the heat pipe having a flattened bottom face coplanar with the bottom face of the core for contacting an electronic device;
    wherein the heat pipe is helical in shape and surrounds the core, and the collar of the radiator has an inner face thereof defining a helical groove receiving the heat pipe therein.

* * * * *